US012603119B2

(12) United States Patent
Chao et al.

(10) Patent No.: US 12,603,119 B2
(45) **Date of Patent: *Apr. 14, 2026**

(54) HOT CARRIER INJECTION PROGRAMMING AND SECURITY

(71) Applicant: Intel Corporation, Santa Clara, CA (US)

(72) Inventors: Yu-Lin Chao, Portland, OR (US); Zhanping Chen, Portland, OR (US); Sarvesh Kulkarni, Hillsboro, OR (US); Rachael Parker, Forest Grove, OR (US); Jyothi Bhaskarr Velamala, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 736 days.

This patent is subject to a terminal disclaimer.

(21) Appl. No.: 17/706,124

(22) Filed: Mar. 28, 2022

(65) Prior Publication Data

US 2023/0162772 A1     May 25, 2023

Related U.S. Application Data

(60) Provisional application No. 63/281,236, filed on Nov. 19, 2021.

(51) Int. Cl.
| | |
|---|---|
| *G11C 7/24* | (2006.01) |
| *G11C 17/16* | (2006.01) |
| *G11C 17/18* | (2006.01) |

(52) U.S. Cl.
CPC ................ G11C 7/24 (2013.01); G11C 17/16 (2013.01); G11C 17/18 (2013.01)

(58) Field of Classification Search
CPC ............ G11C 17/16; G11C 17/18; G11C 7/24
See application file for complete search history.

(56) References Cited

U.S. PATENT DOCUMENTS

| | | | |
|---|---|---|---|
| 11,082,242 | B2 | 8/2021 | Lu |
| 11,321,459 | B2 | 5/2022 | Shen et al. |

(Continued)

OTHER PUBLICATIONS

Balaji et al., "Design of a Delta Threshold Voltage Difference based fully Embedded Read Only Memory along with a Skew Sense Amplifier", 2019 4th International Conference on Recent Trends on Electronics, Information, Communication & Technology (RTEICT-2019), May 17-18, 2019, pp. 475-479.

(Continued)

*Primary Examiner* — Alfredo Bermudez Lozada

(74) *Attorney, Agent, or Firm* — NICHOLSON DE VOS WEBSTER & ELLIOTT LLP

(57) ABSTRACT

Hot carrier injection (HCI) may be used to provide various improvements for one-time programmable (OTP) read-only memory (ROM) or physical unclonable function (PUF) circuits. HCI may be used to write a memory bit (e.g., logical 0 or 1), which may be used in OTP ROM. HCI may be used to provide improved programmable ROM (PROM) memory devices, such as to facilitate programming or to increase sensing window. HCI may also be used to write a memory bit in a PUF circuit. HCI may provide a cross-foundry portable PUF circuit that has an associated adjustable bit error rate (BER), which may be used to secure root key generation, or may be used to provide a unique identification (ID) for fuse replacement.

7 Claims, 15 Drawing Sheets

(56) References Cited

U.S. PATENT DOCUMENTS

| | | | |
|---|---|---|---|
| 11,720,672 B2 | 8/2023 | Shen et al. | |
| 2016/0217832 A1 | 7/2016 | Jayaraman et al. | |
| 2019/0130103 A1* | 5/2019 | Shen | H04L 9/3278 |
| 2019/0356314 A1 | 11/2019 | Lu et al. | |
| 2020/0105356 A1 | 4/2020 | Kulkarni et al. | |
| 2020/0106625 A1* | 4/2020 | Shen | H03K 5/13 |
| 2020/0136840 A1 | 4/2020 | Lee et al. | |
| 2020/0313003 A1* | 10/2020 | Shen | H04L 9/0866 |

OTHER PUBLICATIONS

European Search Report and Search Opinion, EP App. No. 22202542.
1, Mar. 27, 2023, 11 pages.
Non-Final Office Action, U.S. Appl. No. 17/990,575, Jan. 31, 2025,
23 pages.

* cited by examiner

100

WL

130

120

ET   110

EC

SL   140

BL   150

BLB   155

500

510  RECEIVE PROGRAMMING VOLTAGE SIGNAL DURING PROGRAMMING PHASE

520  TRIGGER HOT CARRIER INJECTION IN PROGRAMMABLE CIRCUIT

530  GENERATE HEAT TO FACILITATE HOT CARRIER INJECTION

540  PROVIDE SENSE VOLTAGE DURING SENSING PHASE

550  RECEIVE DIFFERENTIAL SENSE VOLTAGES AT SENSE AMPLIFIER

560  GENERATE SENSED BIT VOLTAGE SIGNAL

570  COUPLE TO SENSE AMPLIFIER DURING SENSING PHASE

ZEROIZE
PBITB_TO1

1360

(0)    (1)

VCC

MNDIODER

1315

PBIT

RST    MNRST
            1330

MNSTRESSL
1340

MNSTRESSR

STRESS'    Y

R2GNDB

MNR2GNDR

1305

STRESS'

MNDNR
        1320

MNDIODEL

PBITB

1325

STRESS'    X

MNSTRESSL

MNDNL
        1310

ZEROIZE
PBITB_TO1

1350

(1)    (0)

R2GND

MNR2GNDL

1400

1410 — RECEIVE BIT VALUE TO BE STORED

1420 — INDUCE HCI IN PUF CELL TO STORE BIT VALUE

1430 — RESET PUF CIRCUIT

1440 — RETRIEVE BIT VALUE FROM PUF CELL DURING EVALUATION PHASE

1450 — RECEIVE ZEROIZER INPUT AT FIRST ZEROIZER GATE

1460 — ZEROIZE FIRST NODE

HOT CARRIER INJECTION PROGRAMMING AND SECURITY

CROSS REFERENCE TO RELATED APPLICATION

This application claims priority to U.S. Provisional Pat. App. No. 63/281,236, filed Nov. 19, 2021, entitled "Hot Carrier Injection Hardened Physically Unclonable Function Circuit," which is incorporated by reference herein in its entirety.

TECHNICAL FIELD

Embodiments described herein generally relate to memory for electronic devices.

BACKGROUND

Electronic circuits may store data within a one-time programmable (OTP) read-only memory (ROM), such as copper (Cu) fuse OTP ROM. Void formation may be used in an OTP ROM to store a bit (e.g., 1 or 0) in a circuit area (e.g., bitcell), however this void formation may lead to significant resistance change. These voids may be visible from top-down de-processing and imaging, thus rendering this technology unacceptable for security applications. Another shortcoming includes forming a void by passing high programming currents (e.g., 10 mA to 30 mA) supplied by large on-chip driver transistors through limited sized metal elements, thus translating to poor element-to-bitcell area and poor energy efficiency. Yet another shortcoming includes the increasing requirements for electronic circuit size reduction, current requirements, and voltage requirements.

Electronic circuits may include a memory element for a physical unclonable function (PUF) circuit, such as static random-access memory (SRAM) or a sense amplifier (SA) latch. Some System-on-a-Chip (SoC) devices use memory elements for a PUF circuit, such as for cryptography or other functions. Memory PUF circuits traditionally use complementary metal-oxide-semiconductor (CMOS) logic. However, these PUF circuit memory elements may suffer from high sensitivity to environmental conditions, which results in an increased error rate. A large amount of error correction coding (ECC) is needed to address the increased error rate, however the ECC is costly to store in non-volatile memory (NVM), which may leak entropy and make the solution less secure.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIG. 10 shows BER fuse mode graph, according to an embodiment.

DETAILED DESCRIPTION

The circuits and methods described herein provide technical solutions for technical problems facing electronic memory circuits. Hot carrier injection (HCI) may be used to provide various improvements for OTP ROM and PUF circuits. In electronic devices, HCI occurs when an electron gains enough kinetic energy to overcome an electron potential barrier. HCI may be induced by reversing a relative polarity of two supply voltages, which may stress circuit transistors using a reverse transistor current.

HCI may be used to write a memory bit (e.g., logical 0 or 1), which may be used in OTP ROM. HCI may be used to provide improved programmable ROM (PROM) memory devices, such as to facilitate programming or to increase sensing window. The number and arrangement of transistors within an HCI PROM may be used for memory programming, memory access (e.g., reading), and for transistor heating to facilitate HCI. A reversed source and drain sensing architecture may be used to increase sensing window, and may allow for isolation of broken bitcell away from the main sensing circuitry.

HCI may also be used to write a memory bit in a PUF circuit. HCI may provide a cross-foundry portable PUF circuit that has an associated adjustable bit error rate (BER), which may be used to secure root key generation because it can be self-contained with no external helper data needed. Additionally, an HCI PUF circuit may be further simplified, such as for applications like unique identification (ID) for fuse replacement.

In the following description, for purposes of explanation, numerous specific details are set forth to provide a thorough understanding of some example embodiments. It will be evident, however, to one skilled in the art that the present disclosure may be practiced without these specific details.

Figure 1:
FIG. 1 is a block diagram illustrating a charge trapping (CT) PROM bitcell circuit, according to an embodiment.

FIG. 1 is a block diagram illustrating a charge trapping (CT) PROM bitcell circuit 100, according to an embodiment. Circuit 100 includes a first MOSFET transistor 110 and an identical second MOSFET transistor 120. A word line WL 130 is coupled to the gates of the transistors, a sense line SL 140 is coupled between the transistors, and the transistors are coupled to differential bit lines BL 150 and BLB 155.

Data may be written during a programming phase to one of the transistors 110 and 120 by biasing WL 130, SL 140, BL 150, and BLB 155 to trigger HCI in that transistor. This HCI causes an elevated threshold voltage (Vt) in the selected transistor compared to the other transistor. During a sensing phase, currents from a pMOS driver through SL 150 would be divided into BL 150 and BLB 155 unequally due to the elevated Vt (e.g., delta Vt) being intentionally programmed into the bitcell. This differential current may be sensed (e.g., detected) by a sense amplifier (SA) and be converted to a digital output.

In contrast with a metal fuse or other physically detectable bit, bitcell circuit 100 relies on delta Vt to store a data bit, and therefore provides improved data security from physical inspection. The current used for programming may be supplied directly from the memory element itself, resulting in a smaller cell size and lower programming current requirements than a metal fuse, which provides improved better area efficiency and energy efficiency.

Figure 2:
FIG. 2 is a circuit diagram illustrating a parallel CT PROM bitcell circuit, according to an embodiment.

FIG. 2 is a circuit diagram illustrating a parallel CT PROM bitcell circuit 200, according to an embodiment. Circuit 200 shows two CT PROM bitcell circuits, which may implement two of the CT PROM bitcell circuits shown in FIG. 1. The CT PROM bitcell circuits may be arranged in parallel along differential bit lines BL 250 and BLB 255. A first bitcell may include a first word line 230 and a first pair of transistors 210 and 220, and include a second bitcell may include a second word line 235 and a second pair of transistors 215 and 225. Circuit 200 may include further bitcells arranged in parallel. The parallel bitcells may be coupled to a sense line SL 240 and differential bit lines BL 250 and BLB 255.

During a programming phase, a pair of programming transistors PGEN 260 and PGENB 265 may be used in combination with one or more of the first word line 230 and the second word line 235 to bias one or more of the transistors 210, 215, 220, or 225. During a sensing phase, the sense line SL 240 may be used to divide currents through one or more of the transistors 210, 215, 220, or 225 to differential bit lines BL 250 and BLB 255 and to a single sense amplifier SA 245 to sense (e.g., read) the written bit.

Figure 3:
FIG. 3 is a block diagram illustrating an access-controlled CT PROM bitcell circuit, according to an embodiment.

FIG. 3 is a block diagram illustrating an access-controlled CT PROM bitcell circuit 300, according to an embodiment. Circuit 300 includes a first element transistor 310 and a second element transistor 320. A programming word line WLP 330 is coupled to the gates of these element transistors 310 and 320, a sense line SL 340 is coupled between the element transistors 310 and 320, and the element transistors 310 and 320 are coupled through programming transistors 360 and 365 to differential bit lines BL 350 and BLB 355.

Circuit 300 further includes a first access transistor AT 370 and second access transistor 375. Access transistors 370 and 375 are coupled to the element transistors 310 and 320 and to programming transistors 360 and 365. Access transistors 370 and 375 are coupled to and controlled by a global sensing word line WLS 335, and are coupled to differential sense bit lines BL 380 and BLB 385.

During the sensing phase, the access transistors 370 and 375 are used as access controllers. During the programming phase, the access transistors 370 and 375 provide additional heat, such as to provide a larger Vt shift at elevated temperatures. At elevated temperatures, reduced silicon (Si) energy bandgap increases carrier density (e.g., electron density) and more carriers under high voltage biases would gain sufficient energy for HCI by overcoming the energy barrier between the conducting channel and dielectric interface. By using access transistors 370 and 375 to provide elevated temperatures for HCI, more electrons are trapped in the dielectric layers, leading to a greater Vt shift than would occur at lower temperatures.

Figure 4:
FIG. 4 is a circuit diagram illustrating an access-controlled parallel CT PROM bitcell circuit, according to an embodiment.

FIG. 4 is a circuit diagram illustrating an access-controlled parallel CT PROM bitcell circuit 400, according to an embodiment. Circuit 400 shows two access-controlled CT PROM bitcell circuits, such as the access-controlled CT PROM bitcell circuits shown in FIG. 3. The architecture in circuit 400 provides a programming path that is separate from the sensing path, and may be used to revert current flow direction between the programming phase and the sensing phase.

Circuit 400 includes a first element transistor 410 and a second element transistor 420. A programming word line WLP 430 is coupled to the gates of these element transistors 410 and 420, a sense line SL 440 is coupled between the element transistors 410 and 420, and the element transistors 410 and 420 are coupled through programming transistors PGEN 460 and PGENB 465 to differential bit lines BL 450 and BLB 455.

Circuit 400 further includes a first access transistor AT 470 and second access transistor 475. Access transistors 470 and 475 are coupled to the element transistors 410 and 420 and to programming transistors PGEN 460 and PGENB 465. During the programming phase, a bit (e.g., 1 or 0), pull-down (PD) programming transistors PGEN 460 and PGENB 465 may be activated to pull their respective nodes to ground, and a programming pMOS may be activated to pull sense line SL 440 high, leading to a large voltage drop across the source and drain of one of element transistors 410 and 420.

During the programming phase, the access transistors 470 and 475 provide additional heat, such as to provide a larger Vt shift for HCI at elevated temperatures. HCI may be induced when WLP 430 is switched on even if WLS 435 remains off. To provide additional heat for HCI, WLS 435 may be activated and a current source inside SA 445 may be activated to provide localized heating to one of element transistors 410 and 420, either by currents flowing from SA 445 to access transistor AT 470 or to access transistor AC 475 and sinking into the corresponding programming transistor PGEN 460 or PGENB 465. The separation of the toggling of the WLS 435 and WLP 430 may be determined based on a silicon circuit layout and may be managed by a digital controller, such as to provide a desired localized heating temperature.

During the sensing phase, the access transistors 470 and 475 are used as access controllers. Access transistors 470 and 475 are further coupled to and controlled by a global sensing word line WLS 435, and are coupled to differential sense bit lines BL 480 and BLB 485 to a single sense amplifier SA 445. Current flow during the sensing phase is reversed from current flow during the programming phase to improve bit detection by enhancing the delta Vt that was programmed into element transistors 410 and 420 during the programming phase. When HCI is induced during programming, the injected charges accumulate at the drain side close to the sense line SL 440, causing a higher local delta Vt at the drain node than at the source node. The reverse biasing of the source and drain terminals during sensing effectively swaps the source and drain terminals, and the locally high Vt at the now-source-terminal would limit amounts of conducting currents more effectively than high Vt at the original drain terminal.

The architecture of the access-controlled parallel CT PROM bitcell circuit 400 provides the ability to program and read multiple bitcells by addressing various transistors and providing the output through the single sense amplifier SA 445. HCI may cause a failure in one of the bitcell due to hot carrier degradation, such as a junction punch-through in one or more of the bitcells. When one bitcell fails in a parallel bitcell architecture without access transistors 470 and 475, the leakage path of the broken bitcell remains coupled through differential sense bit lines BL 480 and BLB 485, which may cause the column of parallel bitcells to fail. However, the use of access transistors 470 and 475 provides the ability to isolate one or more bitcells and continue to use circuit 400 even in the event of a bitcell failure. By reversing the current flow direction between programming and sensing, unselected bitcells may be isolated from differential sense bit lines BL 480 and BLB 485 by turning off access devices, such as by grounding WLS 435. Even if one or more bitcells in a parallel bitcell circuit fail, the leakage path created by that failure would not sink or disturb currents in differential sense bit lines BL 480 and BLB 485 or sense line SL 440 during reading of other healthy bitcells of the same column. The access-controlled parallel CT PROM bitcell circuit 400 may significantly reduce bit-level raw DPM (defects per million), and would allow HCI-based PROM to avoid column-by-column repair and instead applying bit-by-bit repair schemes.

Figure 5:
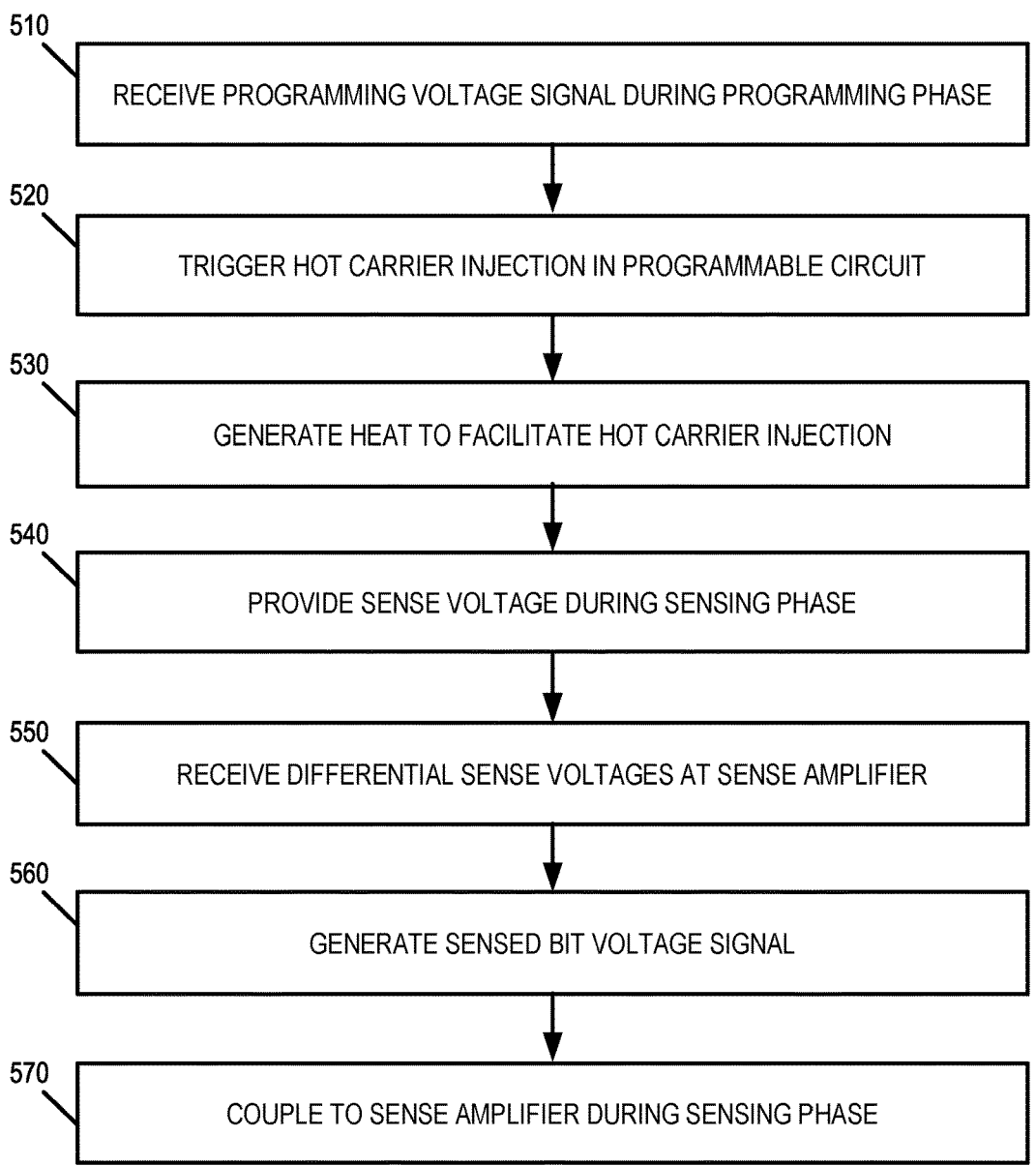
FIG. 5 is a flowchart illustrating a method, according to an embodiment.

FIG. 5 is a flowchart illustrating a method 500, according to an embodiment. Method 500 includes receiving 510 a programming voltage signal at a first word line and triggering 520 a hot carrier injection in a programmable circuit responsive to the programming voltage signal. The programmable circuit includes a first element transistor and a second element transistor coupled to the first word line; a first access transistor coupled to the first element transistor, a second word line, and a first sense bit-line; a first program transistor coupled between the first access transistor and the first element transistor; a second access transistor coupled to the second element transistor, the second word line, and a second sense bit-line; and a second program transistor coupled between the second access transistor and the second element transistor. The first word line, first program transistor, and second program transistor are configured to be biased to program a bit during a programming phase and cause an elevated threshold voltage in at least one of the first element transistor and the second element transistor.

Method 500 may further include generating heat 530 at the first access transistor and the second access transistor during the programming phase to facilitate hot carrier injection. At 540, method 500 may include providing a sense voltage during a sensing phase from a sense line to the first element transistor and the second element transistor. Method 500 may include receiving 550 differential sense voltages during the sensing phase from the first element transistor and the second element transistor at a sense amplifier and generating 560 a sensed bit voltage signal based on the differential sense voltages. At 570, method 500 may further include coupling, at the first access transistor and second access transistor, the first element transistor and the second element transistor to the sense amplifier during the sensing phase. The first word line may be coupled to a first element gate of the first element transistor and to a second element gate of the second element transistor. The second word line may be coupled to a first access gate of the first access transistor and to a second access gate of the second access transistor.

Figure 6:
FIG. 6 is a circuit diagram of a pMOS HCI PUF circuit, according to an embodiment.

FIG. 6 is a circuit diagram of a pMOS HCI PUF circuit 600, according to an embodiment. HCI may be used to write a memory bit in a PUF circuit. HCI PUF circuit 600 includes pMOS transistor M1 610 and pMOS transistor M2 620, which are coupled between a voltage rail V0 605 and respective nodes of first programming bit PBIT 615 and second programming bit PBITB 625. Circuit 600 includes pMOS transistors M3 610 and M4 620, which are arranged to receive an HCI stress input signal. Circuit 600 includes pMOS transistors M5 650 and M6 660, which are coupled between second voltage rail V1 635 and M3 610 and M4 620, respectively. Respective gate terminals of M5 650 and M6 660 are each cross-coupled to source nodes for M3 610 and M4 620, respectively. Circuit 600 further includes reset transistors M7 670, M8 680, and M9 690.

A reset operation may include using reset transistors M7 670, M8 680, and M9 690 to provide a conductive path between PBIT 615 and PBITB 625, which causes PBIT 615 and PBITB 625 to be at or near a common voltage level. The voltages at PBIT 615 and PBITB 625 diverge after the reset operation is terminated using M7 670, M8 680, and M9 690. A read operation may be executed following the termination of the reset operation and divergence of voltages at PBIT 615 and PBITB 625. A stress operation may include applying an HCI stress by reversing the relative polarity of the two rail voltages V0 605 and V1 635, such as in response to a stress input signal received at transistor M3 610 or transistor M4 620. This reversed polarity may cause a revere biasing of either transistor M1 610 or transistor M2 620 in response to a stress input signal received at transistor M4 620 or transistor M3 610, respectively.

Figure 7:
FIG. 7 is a circuit diagram of an n-type metal-oxide-semiconductor (nMOS) HCI PUF circuit, according to an embodiment.

FIG. 7 is a circuit diagram of an n-type metal-oxide-semiconductor (nMOS) HCI PUF circuit 700, according to an embodiment. The nMOS HCI PUF circuit 700 includes an nMOS implementation of the pMOS HCI PUF circuit shown in FIG. 6. HCI PUF circuit 700 includes nMOS transistor M1 710 and nMOS transistor M2 720, which are coupled between a voltage rail V0 705 and M3 710 and M4 720, respectively. Respective gate terminals of M1 710 and M2 720 are each cross-coupled to source nodes for M3 710 and M4 720, respectively. Circuit 700 includes nMOS transistors M3 710 and M4 720, which are arranged to receive an HCI stress input signal. Circuit 700 includes nMOS transistors M5 750 and M6 760, which are coupled between second voltage rail V1 735 and respective nodes of first programming bit PBIT 715 and second programming bit PBITB 725. Circuit 700 further includes reset transistors M7 770, M8 780, and M9 790.

Figure 8:
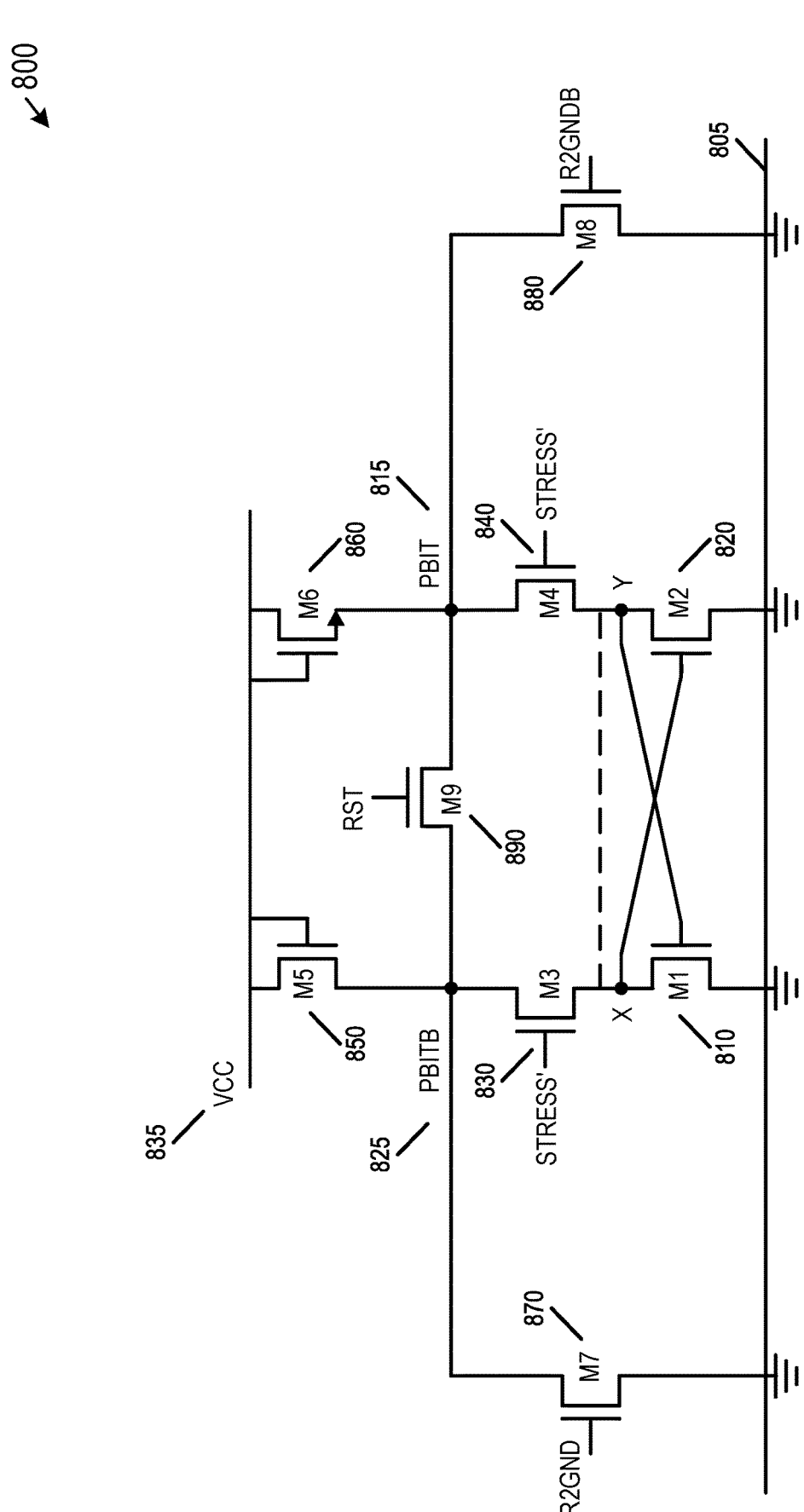
FIG. 8 is a circuit diagram of a pi HCI PUF circuit, according to an embodiment.

FIG. 8 is a circuit diagram of a pi HCI PUF circuit 800, according to an embodiment. Circuit 800 includes a pi-shaped implementation corresponding to the t-shaped implementation shown in FIG. 7. The HCI PUF circuit 800 may provide a denser circuit layout and improved matching. HCI PUF circuit 800 includes transistors M1 810 and M2 820, which are coupled between a ground rail 805 and transistors M3 830 and M4 840, respectively. Gate terminals of M1 810 and M2 820 are each cross-coupled to M3 830 and M4 840, respectively. Transistors M3 830 and M4 840 are arranged to receive an HCI stress input signal. Transistors M5 850 and M6 860 are coupled between second voltage rail VCC 835 and respective nodes of first programming bit PBIT 815 and second programming bit PBITB 825. Circuit 800 further includes reset transistors M7 870, M8 880, and M9 890.

Figures 9A, 9B:
FIGS. 9A-9B show bit error rate (BER) graphs, according to an embodiment.

FIGS. 9A-9B show bit error rate (BER) graphs 900, according to an embodiment. Graphs 900 show average and maximum BER values for an HCI PUF circuit as a function of stress time for three stress voltages. FIG. 9A shows an average BER as a function of stress time, and FIG. 9B shows a maximum BER as a function of stress time. As shown in graphs 900, the average and maximum BER for an HCI PUF circuit may be lowered or driven to zero. This demonstrates the ability of an HCI PUF circuit to withstand enough stress to influence its stochastic output, while preventing another device from probing the HCI PUF circuit to reveal the PUF values, such as to avoid security issues related to probing external oxide anti-fuse based PUF circuits.

Figure 10:
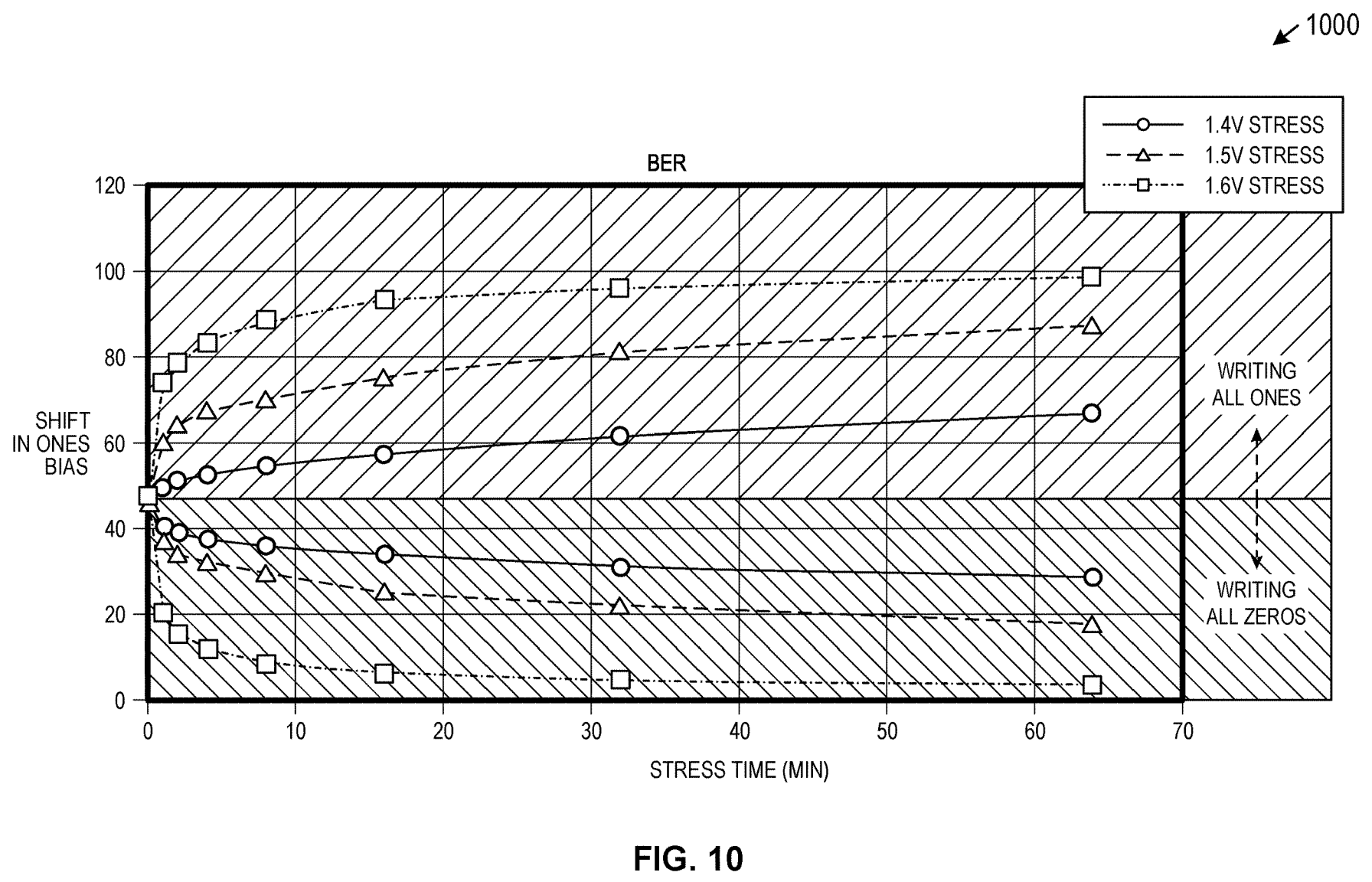

FIG. 10 shows BER fuse mode graph 1000, according to an embodiment. Graph 1000 shows BER for an HCI PUF circuit used in fuse-mode operation. An HCI PUF circuit may be used as a replacement for fuse-based bit storage. In fuse-mode operation, a unique PUF ID may be used to index configuration data that is stored off-die in non-volatile memory (NVM). A non-minimum sized device may be used for the fuse-mode bits to further reduce BER. In fuse-mode operation, HCI performance may be maintained while reducing variations in manufacturing and thermal noise. As shown in graph 1000, a fuse-mode HCI PUF circuit may provide the ability to write all ones or zeros with a low BER (e.g., <5% BER).

Figures 11A, 11B:
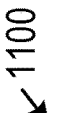
FIGS. 11A-11B show HCI PUF read and stress operations, according to an embodiment.

FIGS. 11A-11B show HCI PUF read and stress operations 1100, according to an embodiment. FIG. 11A shows a read operation for a pi HCI PUF circuit operating in a sensing phase, such as the pi HCI PUF circuit shown in FIG. 8. As shown in FIG. 11A, the read operation causes currents to flow through sensing path 1110. Similarly, FIG. 11B shows a write operation for a pi HCI PUF circuit operating in a programming phase, which causes currents to flow through programming path 1115.

In these pi HCI PUF circuits, transistors MDIODEL 1120 and MNDNR 1135 are cumulatively stronger than their opposites, MDIODER 1125 and MNDNL 1130, causing PBITB 1140 to be equal to 1 and PBIT 1145 to be equal to 0. To reenforce this state, the pi HCI PUF circuit may use a writeback feature to enable MNR2GNDR 1155, which draws high current through MNDIODER 1125 and weaken it with HCI degradation, thereby reinforcing the natural variation. These pi HCI PUF circuits implement the writeback feature before inducing HCI stress. This provides improvements over SRAM or SA latch PUF circuits that use write back of an opposite value in order to induce bias temperature instability (BTI) stress. These HCI stress used in the pi HCI PUF circuits do not require recovery, avoiding the recovery needed for BIT PUF circuits.

Figure 12:
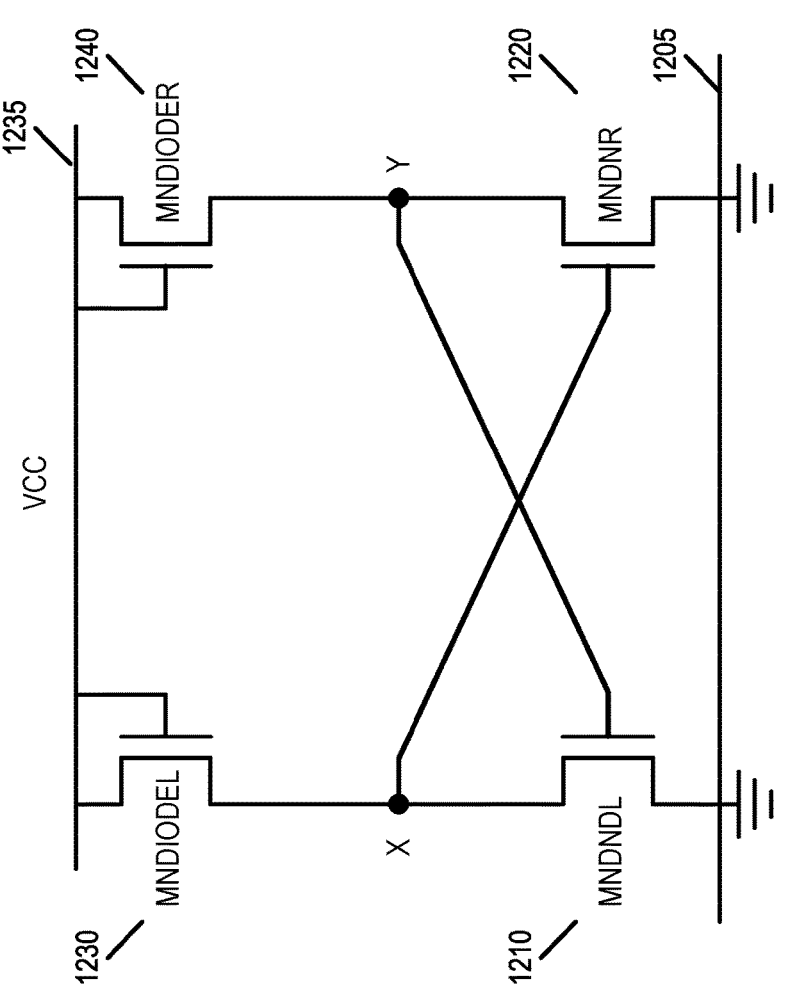
FIG. 12 is a circuit diagram of a four-transistor (4T) HCI PUF circuit, according to an embodiment.

FIG. 12 is a circuit diagram of a four-transistor (4T) HCI PUF circuit 1200, according to an embodiment. 4T HCI PUF circuit 1200 includes transistors MNDNDL 1210 and MNDNR 1220, which are coupled between a ground rail 1205 and transistors MDIODEL 1230 and MDIODER 1240, respectively. Gate terminals of MNDNDL 1210 and MNDNR 1220 are each cross-coupled to MDIODEL 1230 and MDIODER 1240, respectively. Transistors MDIODEL 1230 and MDIODER 1240 are coupled between cross-coupled nodes and second voltage rail VCC 1235.

In some embodiments, 4T HCI PUF circuit 1200 may be used as an NMOS latch. The 4T HCI PUF circuit 1200 is distinct from a CMOS latch implementation. In an example, energizing the 4T HCI PUF circuit 1200 may cause the circuit to evaluate to a random value, and subsequently raising the supply voltage to stress the circuit components may leave the circuit in a post-read state. This may avoid the need to implement a write back or temporal majority voting (TMV). This enables a further reduction in cell size (e.g., close to static random-access memory (SRAM) density), which further reduces post-processing. Other configurations of NMOS latches may be used as a HCI PUF circuit to provide these improvements.

Figure 13:
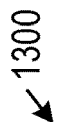
FIG. 13 is a circuit diagram of a zeroizer HCI PUF circuit, according to an embodiment.

FIG. 13 is a circuit diagram of a zeroizer HCI PUF circuit 1300, according to an embodiment. Zeroizer circuit 1300 includes a pi-shaped implementation of HCI PUF circuit, similar to the pi HCI PUF circuit shown in FIG. 8, except that the gates of transistors MNDNL 1310 and MNDNR 1320 are cross-coupled to nodes above the stress isolation transistors MNSTRESSL 1330 and MNSTRESSR 1340. The cross-coupling provides the ability to induce HCI stress in opposite elements, which may be used to bias all PUF circuits to a 1 or 0 depending on the implemented polarity. Zeroizer circuit 1300 further includes a first zeroizer NAND gate 1350 and second zeroizer NAND gate 1360, which may be used to zeroizer circuit 1300, which may improve the security of zeroizer circuit 1300. In an example, first zeroizer NAND gate 1350 may receive a PBIT_TO1 input equal to 1 and second zeroizer NAND gate 1360 may receive a PBITB_TO1 input equal to 0, which may induce an HCI stress to cause PBITB 1325 to equal 0 and PBIT 1315 to equal 1.

One or more of the PUF circuits described herein may be implemented in an integrated circuit (e.g., SoC) or other circuit device to provide a unique ID. In an example, the PUF circuits may be used with a challenge-response authentication or other security scheme. In another example, PUF circuits may be used to reduce or eliminate the need for fuses within an integrated circuit.

Figure 14:
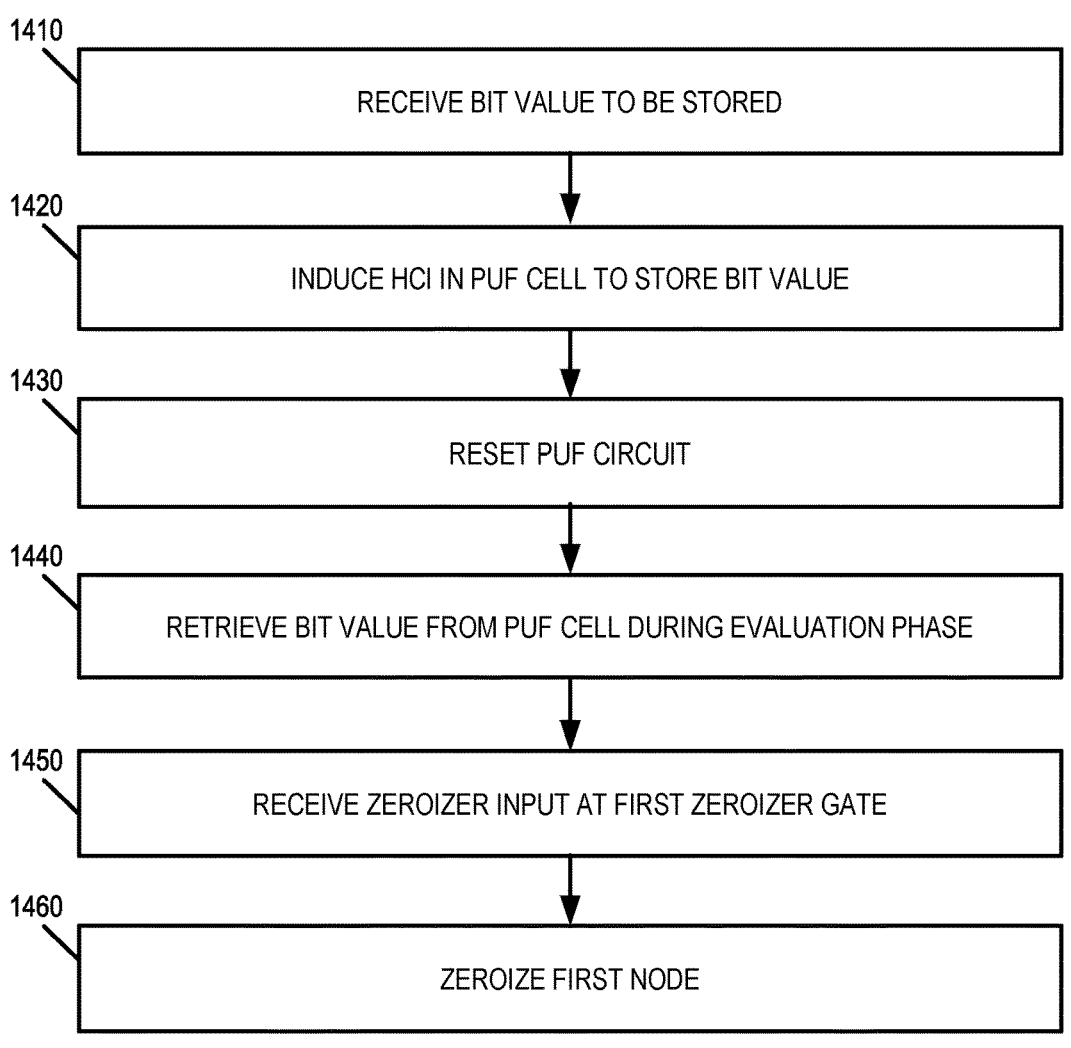
FIG. 14 is a flowchart illustrating a second method, according to an embodiment.

FIG. 14 is a flowchart illustrating a second method 1400, according to an embodiment. Method 1400 includes receiving 1410 a bit value to be stored in a physically unclonable function (PUF) circuit including a PUF cell. The PUF cell may include a first transistor coupled between a first node and ground, a second transistor coupled between a second node and ground, a third transistor coupled between a supply rail and the first node, and a fourth transistor coupled between the supply rail and the second node. A gate terminal of the first transistor may be coupled to the second node and a gate terminal of the second transistor is coupled to the first node, and gate terminals of the third transistor and the fourth transistor may be coupled to the supply rail.

At 1420, method 1400 includes inducing a hot carrier injection in the PUF cell to store the bit value. The PUF cell may further include a first stress transistor coupled between the first node and the first transistor and a second stress transistor coupled between the second node and the second transistor. The first stress transistor and the second stress transistor may be used to induce the hot carrier injection in the PUF cell.

Method 1400 further includes resetting 1430 the PUF circuit. At 1430, method 1400 further includes retrieving the bit value from the PUF cell during an evaluation phase. The resetting 1430 of the PUF circuit may occur prior to the evaluation phase to improve a reliability of retrieving the bit value during the evaluation phase.

Method 1400 further includes receiving 1450 a zeroizer input at a first zeroizer gate. The zeroizer gate may be coupled to a first zeroizer transistor, and the first zeroizer transistor may be coupled to the third transistor. At 1460, method 1400 further includes zeroizing the first node responsive to receiving the zeroizer input. The PUF cell may be included within one or more processors. The one or more processors may be coupled to a memory circuit. A communication interface may be coupled to the one or more processors. In an example, the first, second, third, and fourth transistors include NMOS transistors.

Figure 15:
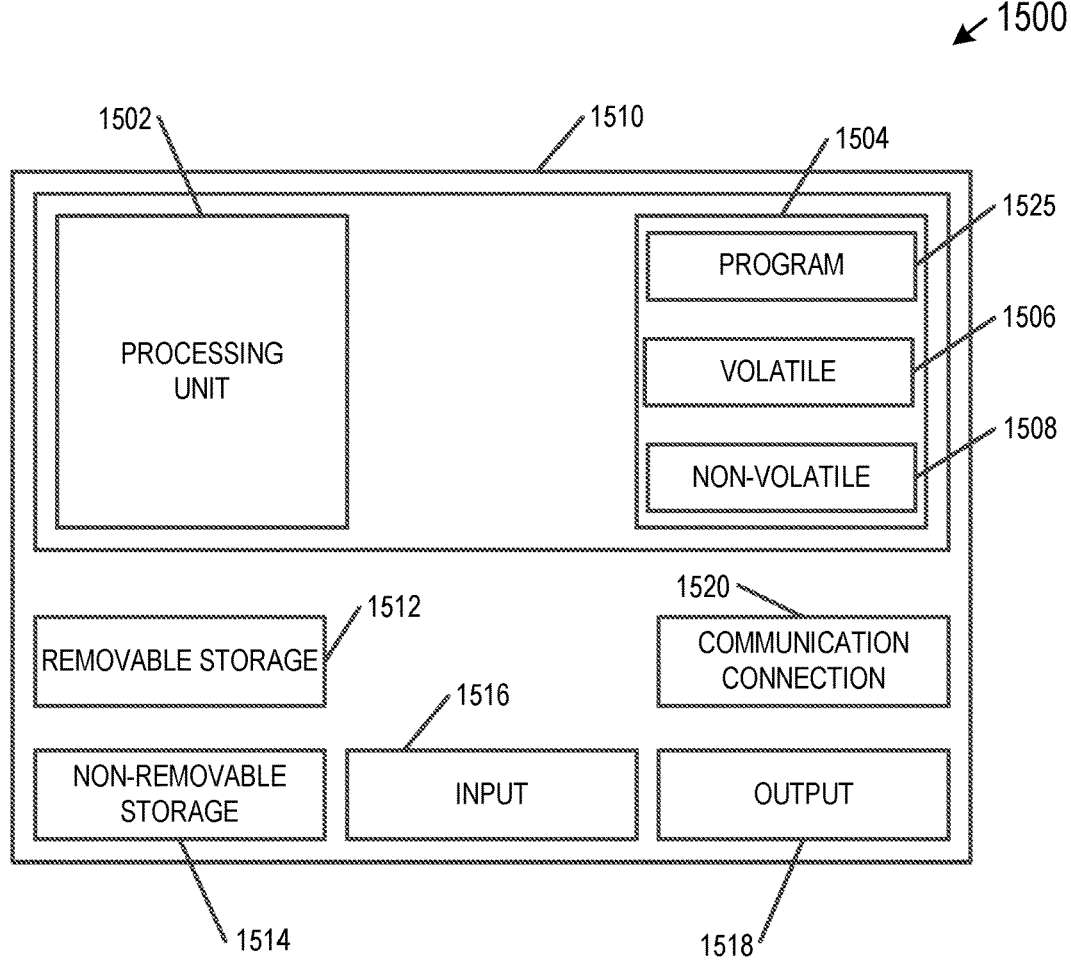
FIG. 15 is a block diagram of a computing device, according to an embodiment.

FIG. 15 is a block diagram of a computing device 1500, according to an embodiment. The performance of one or more components within computing device 1500 may be improved by including one or more of the circuits or circuitry methods described herein. In an example, computing device 1500 includes a first element transistor and a second element transistor coupled to a first word line; a first access transistor coupled to the first element transistor, a second word line, and a first sense bit-line; a first program transistor coupled between the first access transistor and the first element transistor; a second access transistor coupled to the second element transistor, the second word line, and a second sense bit-line; and a second program transistor coupled between the second access transistor and the second element transistor. In an example, computing device 1500 includes a physically unclonable function (PUF) circuit including a PUF cell, the PUF cell including: a first transistor coupled between a first node and ground; a second transistor coupled between a second node and ground, wherein a gate terminal of the first transistor is coupled to the second node and a gate terminal of the second transistor is coupled to the first node; a third transistor coupled between a supply rail and the first node; and a fourth transistor coupled between the supply rail and the second node, wherein gate terminals of the third transistor and the fourth transistor are coupled to the supply rail.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 15 is an example of a client device that may invoke methods described herein over a network. In some embodiments, the computing device of FIG. 15 is an example of one or more of the personal computer, smartphone, tablet, or various servers.

One example computing device in the form of a computer 1510, may include a processing unit 1502, memory 1504, removable storage 1512, and non-removable storage 1514. Although the example computing device is illustrated and described as computer 1510, the computing device may be in different forms in different embodiments. For example, the computing device may instead be a smartphone, a tablet, or other computing device including the same or similar elements as illustrated and described with regard to FIG. 15. Further, although the various data storage elements are illustrated as part of the computer 1510, the storage may include cloud-based storage accessible via a network, such as the Internet.

Returning to the computer 1510, memory 1504 may include volatile memory 1506 and non-volatile memory 1508. Computer 1510 may include or have access to a computing environment that includes a variety of computer-readable media, such as volatile memory 1506 and non-volatile memory 1508, removable storage 1512 and non-removable storage 1514. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 1510 may include or have access to a computing environment that includes input 1516, output 1518, and a communication connection 1520. The input 1516 may include one or more of a touchscreen, touchpad, mouse, keyboard, camera, and other input devices. The input 1516 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 1520 to connect to one or more remote computers, such as database servers, web servers, and another computing device. An example remote computer may include a personal computer (PC), server, router, network PC, a peer device or other common network node, or the like. The communication connection 1520 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 1502 of the computer 1510. A hard drive (magnetic disk or solid state), CD-ROM, and RAM are some examples of articles including a non-transitory computer-readable medium. For example, various computer programs 1525 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

Additional Notes and Examples

Example 1 is an apparatus comprising: a first element transistor and a second element transistor coupled to a first word line; a first access transistor coupled to the first element transistor, a second word line, and a first sense bit-line; a first program transistor coupled between the first access transistor and the first element transistor; a second access transistor coupled to the second element transistor, the second word line, and a second sense bit-line; and a second program transistor coupled between the second access transistor and the second element transistor; wherein the first word line, first program transistor, and second program transistor are configured to be biased to program a bit during a programming phase by triggering hot carrier injection and causing an elevated threshold voltage in at least one of the first element transistor and the second element transistor.

In Example 2, the subject matter of Example 1 includes, wherein the first access transistor and second access transistor are configured to generate heat during the programming phase to facilitate hot carrier injection.

In Example 3, the subject matter of Examples 1-2 includes, a sense line coupled to provide a sense voltage during a sensing phase to the first element transistor and the second element transistor.

In Example 4, the subject matter of Example 3 includes, a sense amplifier coupled to the first element transistor and the second element transistor, the sense amplifier to: receive differential sense voltages during the sensing phase from the first element transistor and the second element transistor; and generate a sensed bit voltage signal based on the differential sense voltages.

In Example 5, the subject matter of Example 4 includes, wherein the first access transistor and second access transistor are configured to couple the first element transistor and the second element transistor to the sense amplifier during the sensing phase.

In Example 6, the subject matter of Examples 1-5 includes, wherein the first word line is coupled to a first element gate of the first element transistor and to a second element gate of the second element transistor.

In Example 7, the subject matter of Example 6 includes, wherein the second word line is coupled to a first access gate of the first access transistor and to a second access gate of the second access transistor.

Example 8 is a method comprising: receiving a programming voltage signal at a first word line; and triggering a hot carrier injection in a programmable circuit responsive to the programming voltage signal, the programmable circuit including: a first element transistor and a second element transistor coupled to the first word line; a first access transistor coupled to the first element transistor, a second word line, and a first sense bit-line; a first program transistor coupled between the first access transistor and the first element transistor; a second access transistor coupled to the second element transistor, the second word line, and a second sense bit-line; and a second program transistor coupled between the second access transistor and the second element transistor; wherein the first word line, first program transistor, and second program transistor are configured to be biased to program a bit during a programming phase and be biased to program a bit during a programming phase and cause an elevated threshold voltage in at least one of the first element transistor and the second element transistor.

In Example 9, the subject matter of Example 8 includes, generating heat at the first access transistor and the second access transistor during the programming phase to facilitate hot carrier injection.

In Example 10, the subject matter of Examples 8-9 includes, providing a sense voltage during a sensing phase from a sense line to the first element transistor and the second element transistor.

In Example 11, the subject matter of Example 10 includes, receiving differential sense voltages during the sensing phase from the first element transistor and the second element transistor at a sense amplifier; and generating a sensed bit voltage signal based on the differential sense voltages.

In Example 12, the subject matter of Example 11 includes, coupling, at the first access transistor and second access transistor, the first element transistor and the second element transistor to the sense amplifier during the sensing phase.

In Example 13, the subject matter of Examples 8-12 includes, wherein the first word line is coupled to a first element gate of the first element transistor and to a second element gate of the second element transistor.

In Example 14, the subject matter of Example 13 includes, wherein the second word line is coupled to a first access gate of the first access transistor and to a second access gate of the second access transistor.

Example 15 is an apparatus comprising: a physically unclonable function (PUF) circuit including a PUF cell, the PUF cell including: a first transistor coupled between a first node and ground; a second transistor coupled between a second node and ground, wherein a gate terminal of the first transistor is coupled to the second node and a gate terminal of the second transistor is coupled to the first node; a third transistor coupled between a supply rail and the first node; and a fourth transistor coupled between the supply rail and the second node, wherein gate terminals of the third transistor and the fourth transistor are coupled to the supply rail.

In Example 16, the subject matter of Example 15 includes, wherein the PUF cell further includes: a first stress transistor coupled between the first node and the first transistor; and a second stress transistor coupled between the second node and the second transistor.

In Example 17, the subject matter of Examples 15-16 includes, wherein the PUF cell further includes a zeroizer.

In Example 18, the subject matter of Examples 15-17 includes, a plurality of PUF cells.

In Example 19, the subject matter of Examples 15-18 includes, a control circuit to energize the PUF cell to evaluate to a random value and subsequently raise a supply voltage on the supply rail.

In Example 20, the subject matter of Examples 15-19 includes, one or more processors that include the PUF cell; a memory circuit coupled to the one or more processors; and a communication interface coupled to the one or more processors.

In Example 21, the subject matter of Example 20 includes, one or more antennas coupled to the one or more processors.

In Example 22, the subject matter of Examples 15-21 includes, wherein: the first transistor includes a first NMOS transistor; the second transistor includes a second NMOS transistor; the third transistor includes a third NMOS transistor; and the fourth transistor includes a fourth NMOS transistor.

Example 23 is a method comprising: receiving a bit value to be stored in a physically unclonable function (PUF) circuit including a PUF cell, the PUF cell including: a first transistor coupled between a first node and ground; a second transistor coupled between a second node and ground, wherein a gate terminal of the first transistor is coupled to the second node and a gate terminal of the second transistor is coupled to the first node; a third transistor coupled between a supply rail and the first node; and a fourth transistor coupled between the supply rail and the second node, wherein gate terminals of the third transistor and the fourth transistor are coupled to the supply rail; and inducing a hot carrier injection in the PUF cell to store the bit value.

In Example 24, the subject matter of Example 23 includes, wherein: the PUF cell further includes a first stress transistor coupled between the first node and the first transistor; the PUF cell further includes a second stress transistor coupled between the second node and the second transistor; and the first stress transistor and the second stress transistor induce the hot carrier injection in the PUF cell.

In Example 25, the subject matter of Examples 23-24 includes, retrieving the bit value from the PUF cell during an evaluation phase.

In Example 26, the subject matter of Example 25 includes, resetting the PUF circuit prior to the evaluation phase to improve a reliability of retrieving the bit value during the evaluation phase.

In Example 27, the subject matter of Examples 23-26 includes, receiving a zeroizer input at a first zeroizer gate, the zeroizer gate coupled to a first zeroizer transistor, the first zeroizer transistor coupled to the third transistor; and zeroizing the first node responsive to receiving the zeroizer input.

In Example 28, the subject matter of Examples 23-27 includes, energizing the PUF cell to evaluate to a random value and subsequently raise a supply voltage on the supply rail.

In Example 29, the subject matter of Examples 23-28 includes, wherein: one or more processors include the PUF cell; a memory circuit is coupled to the one or more processors; and a communication interface is coupled to the one or more processors.

In Example 30, the subject matter of Examples 23-29 includes, wherein: the first transistor includes a first NMOS transistor; the second transistor includes a second NMOS transistor; the third transistor includes a third NMOS transistor; and the fourth transistor includes a fourth NMOS transistor.

Example 31 is at least one machine-readable medium including instructions that, when executed by processing circuitry, cause the processing circuitry to perform operations to implement of any of Examples 1-30.

Example 32 is an apparatus comprising means to implement of any of Examples 1-30.

Example 33 is a system to implement of any of Examples 1-30.

Example 34 is a method to implement of any of Examples 1-30.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. An apparatus comprising:
a physically unclonable function (PUP) circuit including a PUP cell, the PUP cell including:
a first transistor coupled between a first node and ground;
a second transistor coupled between a second node and ground, wherein a gate terminal of the first transistor is coupled to the second node and a gate terminal of the second transistor is coupled to the first node;
a third transistor coupled between a supply rail and the first node;
a fourth transistor coupled between the supply rail and the second node, wherein gate terminals of the third transistor and the fourth transistor are coupled to the supply rail; and
first, second, and third reset transistors, wherein the first and second reset transistors are coupled together at a common reset node, the first and second reset transistors together are coupled between the first and second nodes, and the third reset transistor is coupled between the common reset node and the ground, wherein the PUP cell further includes a zeroizer.

2. The apparatus of claim 1, wherein the PUP cell further includes:
a first stress transistor coupled between the first node and the first transistor; and
a second stress transistor coupled between the second node and the second transistor.

3. The apparatus of claim 1, further including a plurality of PUP cells.

4. The apparatus of claim 1, further including a control circuit to energize the PUP cell to evaluate to a random value and subsequently raise a supply voltage on the supply rail.

5. The apparatus of claim 1, further including:
one or more processors that include the PUP cell;
a memory circuit coupled to the one or more processors; and
a communication interface coupled to the one or more processors.

6. The apparatus of claim 5, further including one or more antennas coupled to the one or more processors.

7. The apparatus of claim 1, wherein:
the first transistor includes a first NMOS transistor;
the second transistor includes a second NMOS transistor;
the third transistor includes a third NMOS transistor; and
the fourth transistor includes a fourth NMOS transistor.

* * * * *